(12) United States Patent
Suzuki et al.

(10) Patent No.: US 9,616,613 B2
(45) Date of Patent: Apr. 11, 2017

(54) IMPRINT APPARATUS INCLUDING ALIGNMENT AND OVERLAY MEASUREMENT

(71) Applicant: CANON KABUSHIKI KAISHA, Tokyo (JP)

(72) Inventors: Akiyoshi Suzuki, Tokyo (JP); Ken-ichiro Shinoda, Utsunomiya (JP); Mitsuru Hiura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 599 days.

(21) Appl. No.: 13/754,971

(22) Filed: Jan. 31, 2013

(65) Prior Publication Data

US 2013/0193602 A1    Aug. 1, 2013

(30) Foreign Application Priority Data

Jan. 31, 2012  (JP) ................. 2012-018637

(51) Int. Cl.
  *G03F 7/00*    (2006.01)
  *B29C 59/00*   (2006.01)
  (Continued)

(52) U.S. Cl.
  CPC ............ *B29C 59/002* (2013.01); *B82Y 10/00* (2013.01); *B82Y 40/00* (2013.01); *G03F 7/0002* (2013.01); *G03F 9/7038* (2013.01); *G03F 9/7042* (2013.01); *G03F 9/7084* (2013.01); *G03F 9/7088* (2013.01)

(58) Field of Classification Search
  None
  See application file for complete search history.

(56) References Cited

U.S. PATENT DOCUMENTS 6,921,615 B2   7/2005  Sreenivasan et al.
7,535,549 B2   5/2009  Cherala et al.
(Continued)

FOREIGN PATENT DOCUMENTS

CN    1476551 A      2/2004
CN    101379435 A    3/2009
(Continued)

OTHER PUBLICATIONS

Notification of the first Office Action issued Jul. 8, 2014, in corresponding Chinese Patent Application No. 201310029991.1. English Translation provided.

(Continued)

*Primary Examiner* — Benjamin Schiffman
(74) *Attorney, Agent, or Firm* — Rossi, Kimms & McDowell LLP

(57) ABSTRACT

An imprint apparatus cures an imprint material, while a pattern formed on a mold is kept in contact with the imprint material, thereby transferring the pattern onto the imprint material. The apparatus includes a measurement unit which performs, in parallel, alignment measurement in which a relative position between the mold and a shot region on the substrate, to which the pattern is to be transferred, is measured so as to align the mold and the shot region, and overlay measurement in which a relative position between a first pattern already formed in another shot region on the substrate using the mold, and a second pattern underlying the first patter is measured.

16 Claims, 16 Drawing Sheets

(51) Int. Cl.
*G03F 9/00* (2006.01)
*B82Y 10/00* (2011.01)
*B82Y 40/00* (2011.01)

(56) References Cited

U.S. PATENT DOCUMENTS

| | | |
|---|---|---|
| 7,630,067 B2 | 12/2009 | Nimmakayala et al. |
| 2007/0222960 A1 | 9/2007 | Van Der Schaar et al. |
| 2009/0095711 A1 | 4/2009 | Koshiba et al. |
| 2010/0110434 A1 | 5/2010 | Choi et al. |
| 2011/0074064 A1 | 3/2011 | Hayashi |
| 2011/0290136 A1 | 12/2011 | Koga |

FOREIGN PATENT DOCUMENTS

| | | |
|---|---|---|
| JP | 2009088264 A | 4/2009 |
| JP | 2011061025 A | 3/2011 |
| JP | 2011097025 A | 5/2011 |

OTHER PUBLICATIONS

"M.Colburn et al.:""Step and flash imprint lithography: a new approach to high resolution patterning""", Proc. SPIE 3676 ""Emerging Lithographic Technologies III"" (1999) 379" Cited in spec.

"E.E.Moon et al.:""Application of interferometric broadband imaging alignment on an experimental x-ray stepper""", J. Vac.Sci. Technol. B 16(6), Nov./Dec. (1998) 3631" Cited in spec.

Japanese Office Action issued in Japanese counterpart application No. JP2012018637, dated Oct. 23, 2015.

FIG. 1

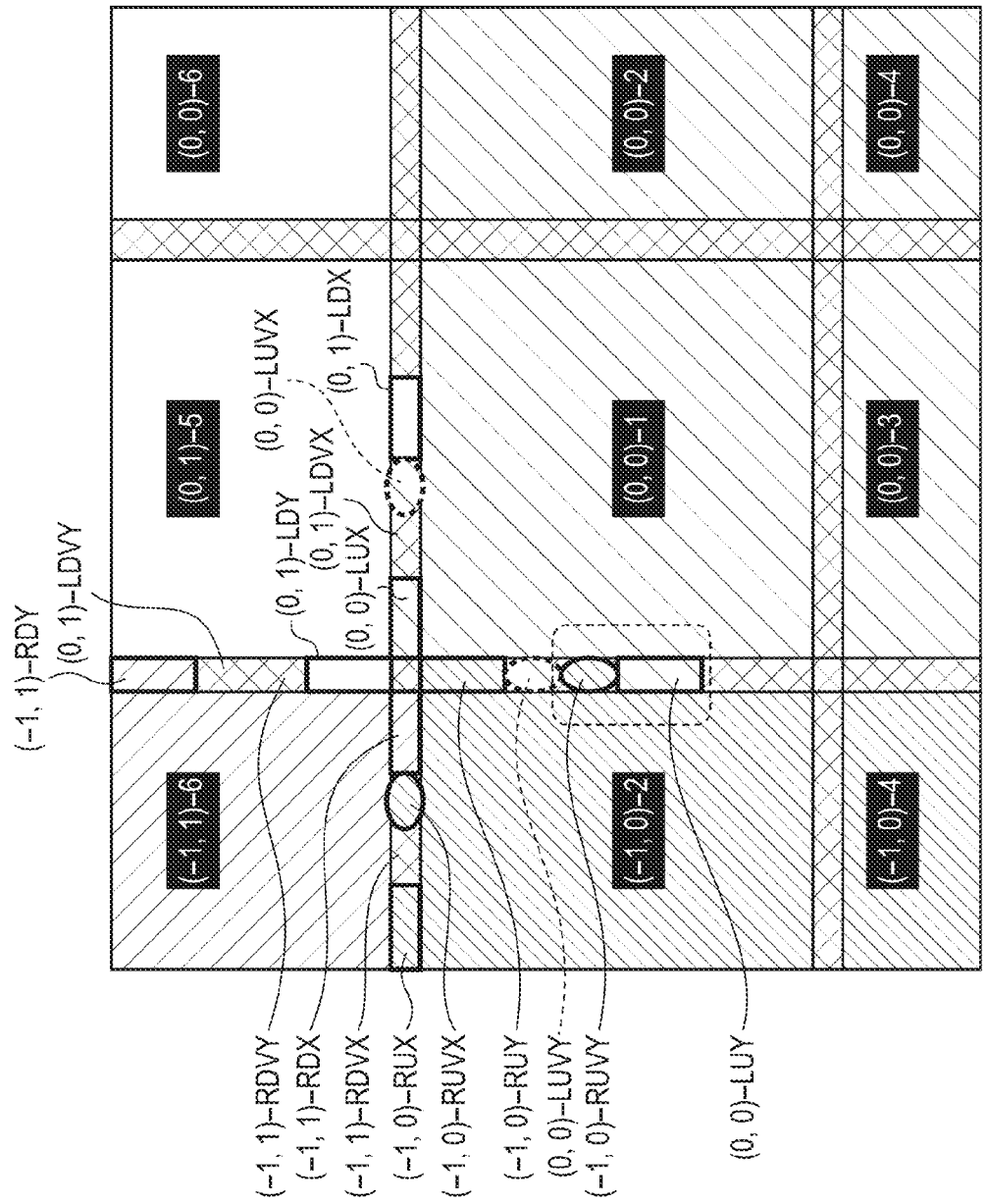

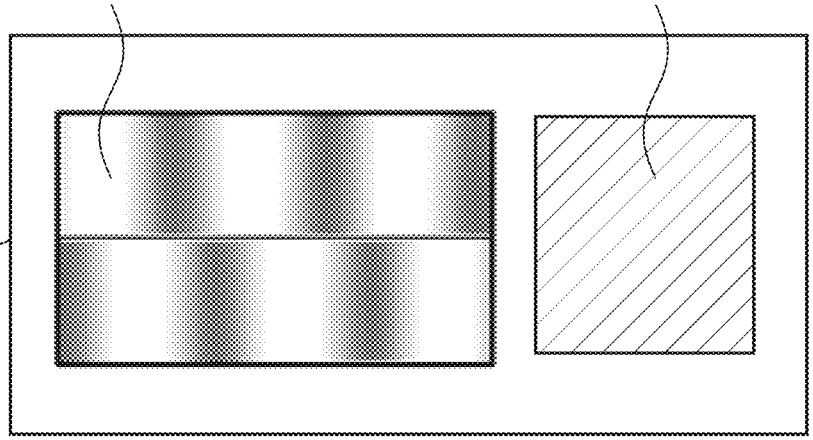
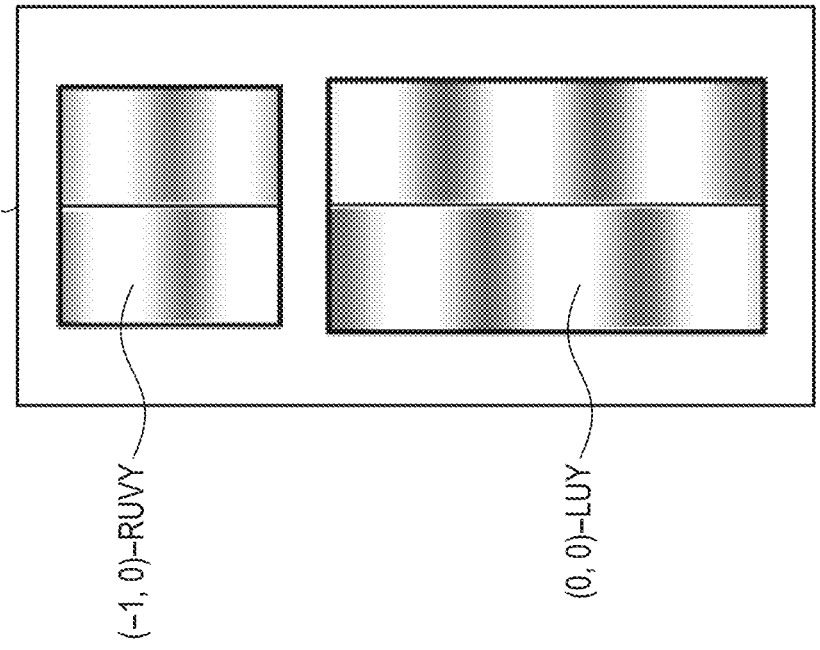

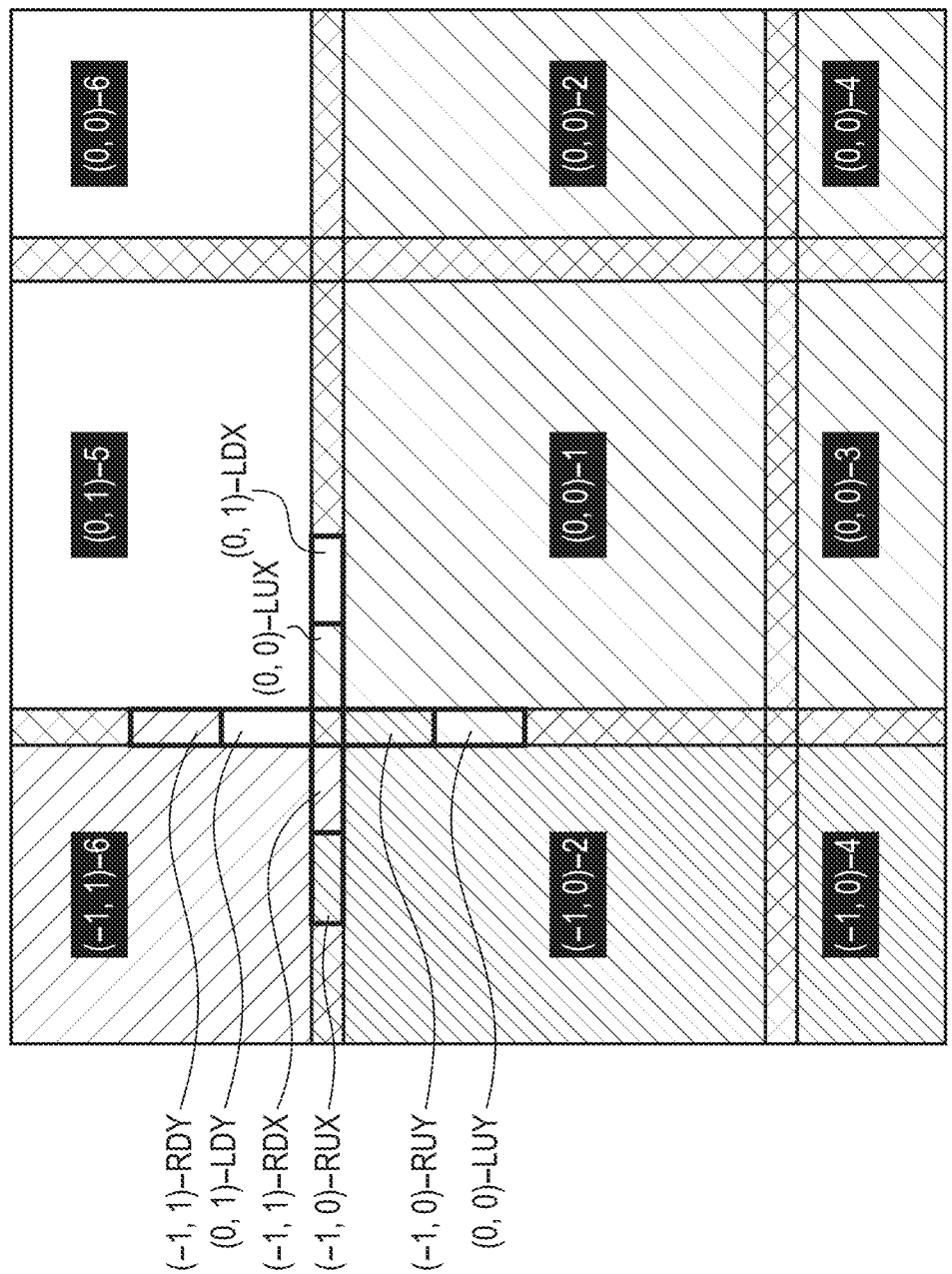

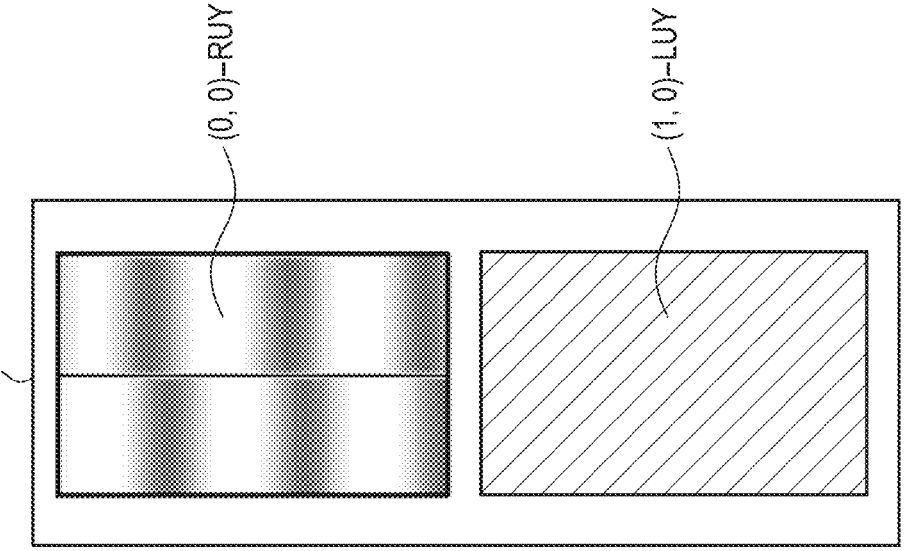
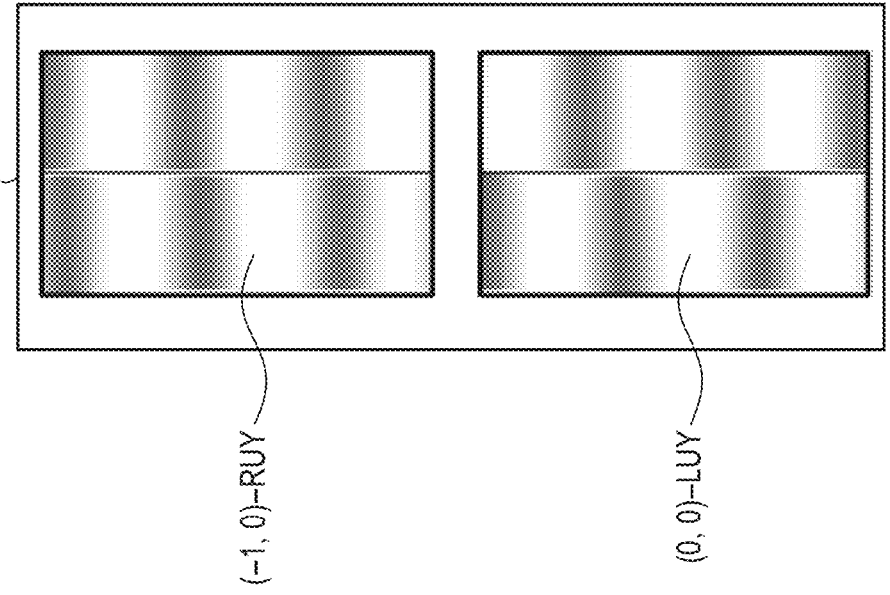

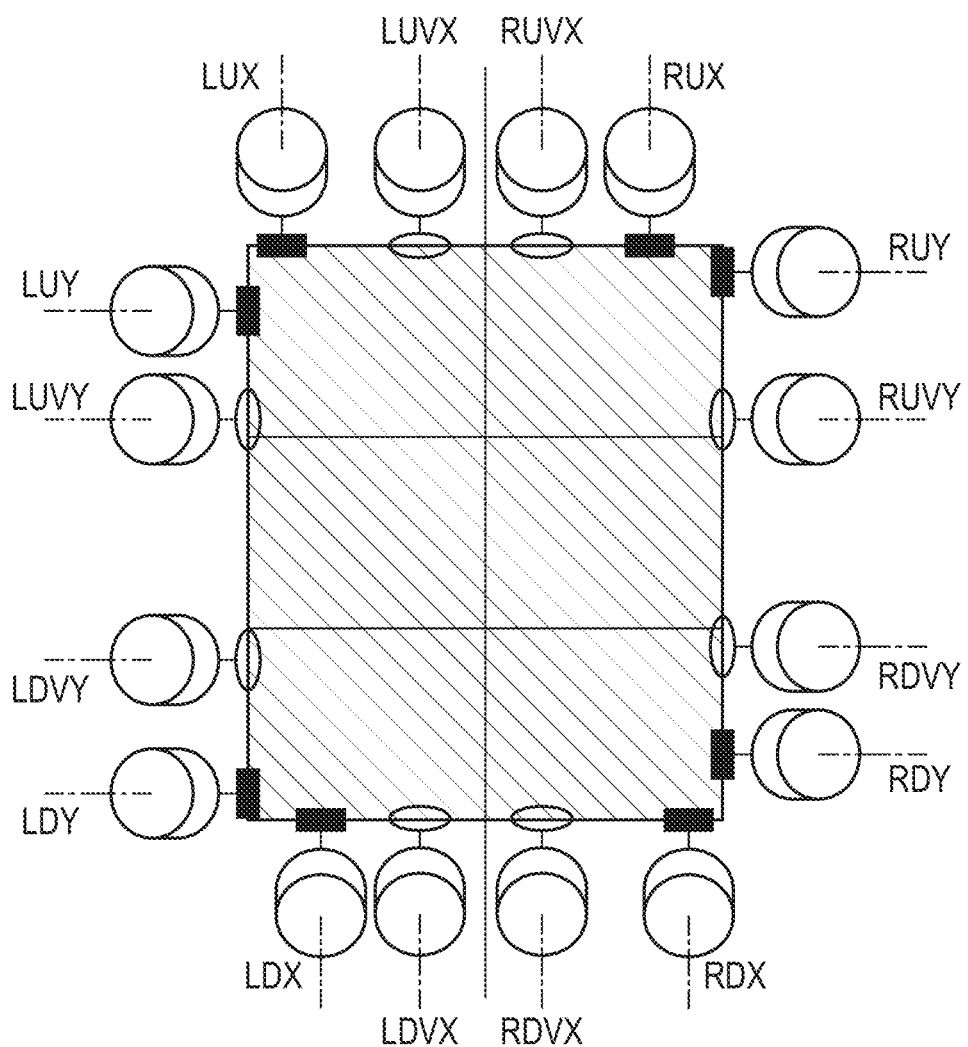
F I G. 12

IMPRINT APPARATUS INCLUDING ALIGNMENT AND OVERLAY MEASUREMENT

BACKGROUND OF THE INVENTION

Field of the Invention

The present invention relates to an imprint apparatus and a method of manufacturing an article using the same.

Description of the Related Art

The imprint technique uses an optical exposure apparatus to form a fine pattern on a substrate such as a silicon wafer or a glass plate using, as an original, a mold having a fine pattern formed on it. A fine pattern is formed by dispensing/spreading or coating a resin (an imprint material) onto a substrate, and curing the resin while keeping the pattern of a mold in contact with the resin.

The imprint technique includes the heat cycle method and photo-curing method. In the heat cycle method, a thermoplastic resin is heated to the temperature equal to or higher than its glass transition temperature, and a mold is brought into contact with the resin while its fluidity is kept high. After the resin is cured by cooling, the mold is separated from the cured resin. In the photo-curing method, while a mold made of an optically transparent material such as quartz is kept in contact with a resin, the resin is irradiated with ultraviolet rays to cure the resin, and the mold is separated from the cured resin. The heat cycle method prolongs the transfer time due to factors associated with temperature control, and degrades the size accuracy or position accuracy due to changes in temperature. On the other hand, the photo-curing method has no such drawbacks and is therefore advantageously applied to mass production of semiconductor devices.

Until today, a variety of imprint apparatuses have been put into practical use in accordance with the resin curing methods and the purposes of use. Assuming an apparatus is intended for the mass production of, for example, semiconductor devices, an apparatus which exploits a scheme called jet-and-flash imprint lithography (to be abbreviated as J-FIL hereinafter) is effective. An imprint apparatus suitable for J-FIL is disclosed in M. Colburn et al.: "Step and flash imprint lithography: a new approach to high resolution patterning", Proc. SPIE 3676 "Emerging Lithographic Technologies III" (1999) 379 (non-patent literature 1). Such an imprint apparatus includes a substrate stage, resin dispenser, imprint head, light irradiation system, and positioning alignment mark detection mechanism. An imprint operation is performed by the step-and-repeat scheme, as in a light exposure apparatus.

An alignment operation in the conventional imprint apparatus is performed in the following way. Alignment marks are formed on a substrate and a mold. At the start of an imprint operation for each shot region on the substrate, first, the mold is brought into contact with the resin. The alignment marks formed on the mold are observed through a microscope system with those formed in the shot region to be processed. The mold and the substrate are aligned based on the detected amount of shift, and the resin is cured. After the curing operation, the mold is separated from the substrate, and the process shifts to the next shot region.

The above-mentioned processes are performed for all shot regions. The scheme in which alignment is performed for each shot region is commonly called the die-by-diedie-by-die (D×D) alignment scheme, and widely used in imprint apparatuses. The moire scheme is available as an actual alignment method. The moire scheme has been known since an X-ray exposure apparatus was developed, and is described in, for example, U.S. Pat. No. 7,630,067 (patent literature 1) and E. E. Moon et al.: "Application of interferometric broadband imaging alignment on an experimental x-ray stepper", J. Vac. Sci. Technol. B 16(6), November/December (1998) 3631 (non-patent literature 2).

Note that in this specification, an operation of bringing the pattern of a mold into contact with a resin, and curing the resin, thereby transferring this pattern onto the resin will be referred to as imprinting or an imprint operation hereinafter. Also, a region which is defined on a substrate and in which a pattern is formed by one imprint operation will be referred to as a shot region hereinafter. One shot region includes one or a plurality of chips. The chip is eventually packaged to fabricate a device.

The alignment scheme adopted in the conventional optical exposure apparatus is called global alignment, in which alignment is performed faithfully to a grid formed on a substrate in advance. In the global alignment scheme, the positions of a reticle and substrate are monitored by a laser interferometer or an encoder with respect to an apparatus reference, thereby aligning them. In this case, it is difficult to directly monitor the positions of a thin reticle and a substrate in practice. Accordingly, the positions of a reticle chuck and a substrate chuck which hold the reticle and the substrate, respectively, are monitored. This requires the system to tightly fix the reticle and the substrate to the reticle chuck and the substrate chuck, respectively, so as to prevent their positions from shifting.

However, in the case of imprinting, not only to bring a mold into contact with a resin on a substrate, but also to separate the mold from the cured resin, give a considerable force between the substrate and the mold. With regard to the substrate, although the substrate is chucked by a substrate chuck by, for example, vacuum suction, it may be pulled in the separation procedure of the mold from the resin, leading to a change in the relative position between the substrate chuck and the substrate on the level of nanometers. When the relative position between the substrate chuck and the substrate changes in the separation procedure, the global alignment scheme cannot be adopted, because it assumes no change in the relative position. Therefore, the die-by-die scheme is advantageous in imprinting, for the mold and the substrate are aligned in each shot so that the movement of the substrate on the substrate chuck can be compensated.

Instead of the global alignment used in optical exposure apparatus, the die-by-die scheme is adopted in imprinting for the above-mentioned special reason. However, the die-by-die scheme has rarely been used in the conventional alignment operation for full-scale semiconductor mass production. The following problem is posed.

In the global alignment scheme, since a grid formed on a substrate in advance is used, shot regions in which a new grid is formed after the global alignment have a strong correlation between them with the grids' matching. However, in the die-by-die scheme, since alignment and imprint operations are repeated for each shot, the shot regions have no correlation between the former grid after alignment because there exists no grid formation concept in the die-by-die system.

In the conventional global alignment scheme, the alignment state of the entire shots on the substrate can be analogically determined based on the above-mentioned correlation. The alignment status of the substrate can be inspected through observing only several shots within the substrate. On the other hand, in the die-by-die scheme, the shot regions have no correlation each other, so the alignment status of the entire substrate cannot be determined by sampling a small number of shots within the substrate. More specifically, it is necessary to inspect all shot regions. Inspection of all shot regions is impractical in terms of time and cost.

SUMMARY OF THE INVENTION

In this invention, a technique advantageous in measuring the alignment status of individual shot regions is provided.

One of the aspects of the present invention provides an imprint apparatus which cures an imprint material, while a pattern formed on a mold is kept in contact with the imprint material, thereby transferring the pattern onto the imprint material, the apparatus comprising: a measurement unit which performs, in parallel, alignment measurement in which a relative position between the mold and a shot region on the substrate, to which the pattern is to be transferred, is measured so as to align the mold and the shot region, and overlay measurement in which a relative position between a first pattern already formed in another shot region on the substrate using the mold, and a second pattern underlying the first patter is measured.

Further features of the present invention will become apparent from the following description of exemplary embodiments with reference to the attached drawings.

BRIEF DESCRIPTION OF THE DRAWINGS

FIG. 1 is a view illustrating an array of shot regions on a substrate;

FIG. 5 is a view corresponding to a region indicated by a dotted frame in FIG. 1;

FIGS. 6A and 6B are views illustrating moire fringes observed through scopes;

FIG. 9 is a view illustrating the arrangement of marks;

FIGS. 10A and 10B are views illustrating moire fringes observed through scopes;

FIG. 12 is a view illustrating the arrangement of scopes;

DESCRIPTION OF THE EMBODIMENTS

Embodiments of the present invention will be described below with reference to the accompanying drawings.

First Embodiment

Figure 3:
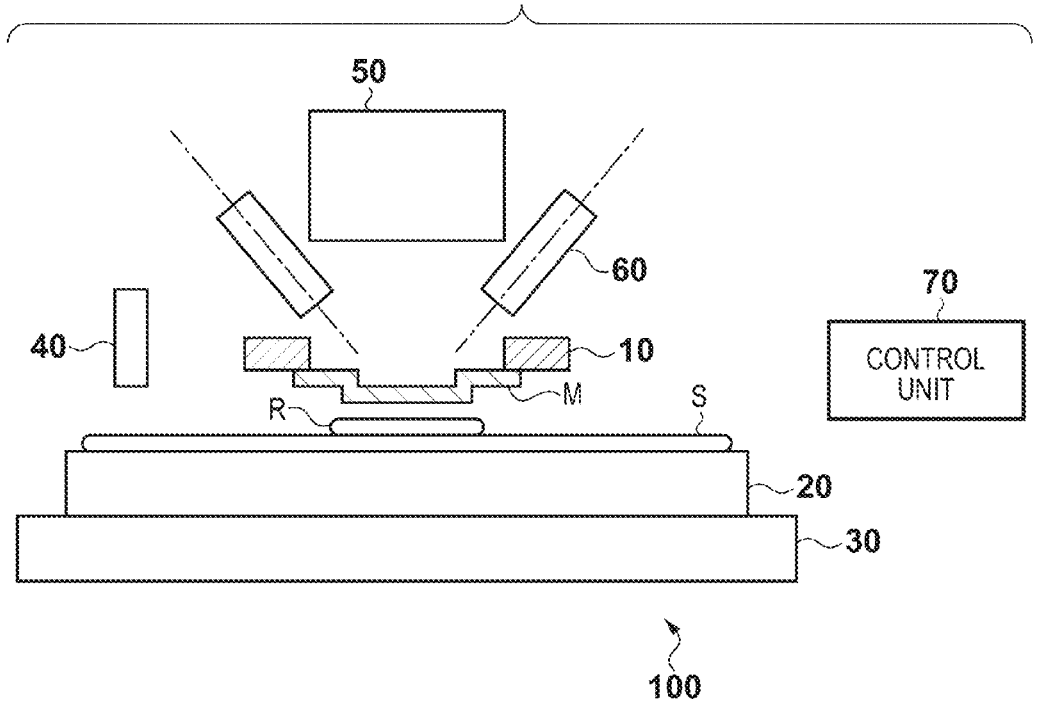
FIG. 3 is a view illustrating the configuration of an imprint apparatus.

FIG. 3 is a view showing the configuration of an imprint apparatus 100 according to an embodiment of the present invention. The imprint apparatus 100 is configured to cure a resin R (imprint material), which is dispensed on a substrate S such as a wafer, while a pattern formed on a mold M is kept in contact with the resin R, thereby transferring the pattern onto the resin R. The imprint apparatus 100 includes, for example, an imprint head 10, substrate stage 20, base plate 30, dispenser 40, curing unit 50, measurement unit 60, and control unit 70. The substrate stage 20 includes a substrate chuck which chucks the substrate S. The substrate stage 20 installed on the base plate 30 uses its internal driving mechanism to position the substrate S. The dispenser 40 dispenses the resin R onto the substrate S. The imprint head 10 holds the mold M, and brings a pattern formed in the pattern region on the mold M into contact with the resin R dispensed on the substrate S. The curing unit 50 cures the resin R upon completion of alignment while the pattern formed on the mold M is kept in contact with the resin R dispensed on the substrate S. Typically, the curing unit 50 irradiates the resin R with light such as ultraviolet rays.

The measurement unit 60 performs alignment measurement and overlay measurement in parallel. Note that the alignment measurement means measurement of the relative position between the mold M and the shot region to which the pattern is to be transferred. After the alignment measurement, the mold M is aligned to the shot region to which the pattern is to be transferred. The overlay measurement means measurement of the relative position of the imprinted shot. It measures the relative position between an imprinted first pattern on the mold M, and a second pattern in the shot region, and confirms the alignment state of the imprinted shot. The shot region and the mold M are aligned by driving the substrate stage 20 and/or driving the mold M using the imprint head 10. The position of the measurement unit 60 is variable because the size of the shot region changes depending on the shape of a semiconductor device.

The measurement unit 60 includes a scope which observes information indicating the relative position between marks, such as moire fringes formed by a mark formed on the mold M and a mark formed in each shot region on the substrate S. Alternatively, the measurement unit 60 includes a scope which observes a mark formed on the mold M and a mark formed in each shot region on the substrate S.

The control unit 70 is configured to control the imprint head 10, substrate stage 20, dispenser 40, curing unit 50, and measurement unit 60. The control unit 70 controls an imprint operation of transferring a pattern formed on the mold M onto the resin R dispensed on the substrate S by a series of operations of bringing the pattern onto the resin R, spreading resin within a shot, performing an alignment operation, and then curing the resin R. The control unit 70 is also configured to output information indicating the alignment status (for example, an alignment error for each shot region) observed using the measurement unit 60.

Figure 1:
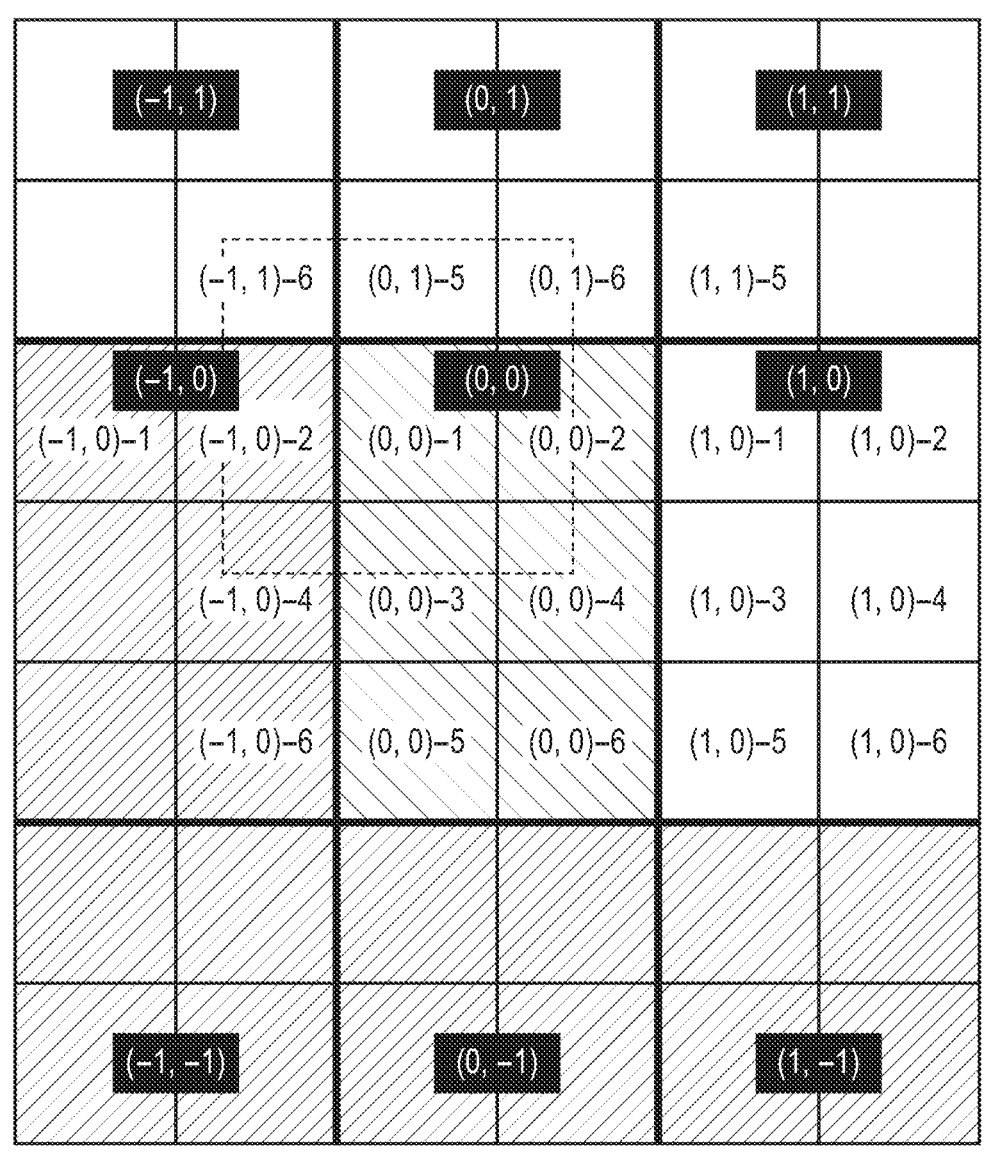

FIG. 1 is a view illustrating an array of shot regions on the substrate S. Referring to FIG. 1, one shot region is formed by six chip regions. Each shot region is represented by "(x, y)," and each number suffixed to "(x, y)–" serves to identify a plurality of chips which form one shot region. In this specification, a shot region to be imprinted next is defined as (0, 0). Eight shot regions (−1, −1), (−1, 0), (−1, 1), (0, −1), (0, 1), (1, −1), (1, 0), and (1, 1) surround shot region (0, 0). Referring to FIG. 1, shot regions (−1, −1), (0, −1), (1, −1), and (−1, 0) on the lower and left sides of shot region (0, 0) are already imprinted.

Marks used for alignment measurement (to be referred to as alignment marks hereinafter) and marks used for overlay measurement (to be referred to as overlay measurement marks hereinafter) can be the same. But, in order to save the mark area, they can be different from each other. In this embodiment, hereinafter, we assume the alignment marks and overlay measurement marks are different from each other.

Figure 2:
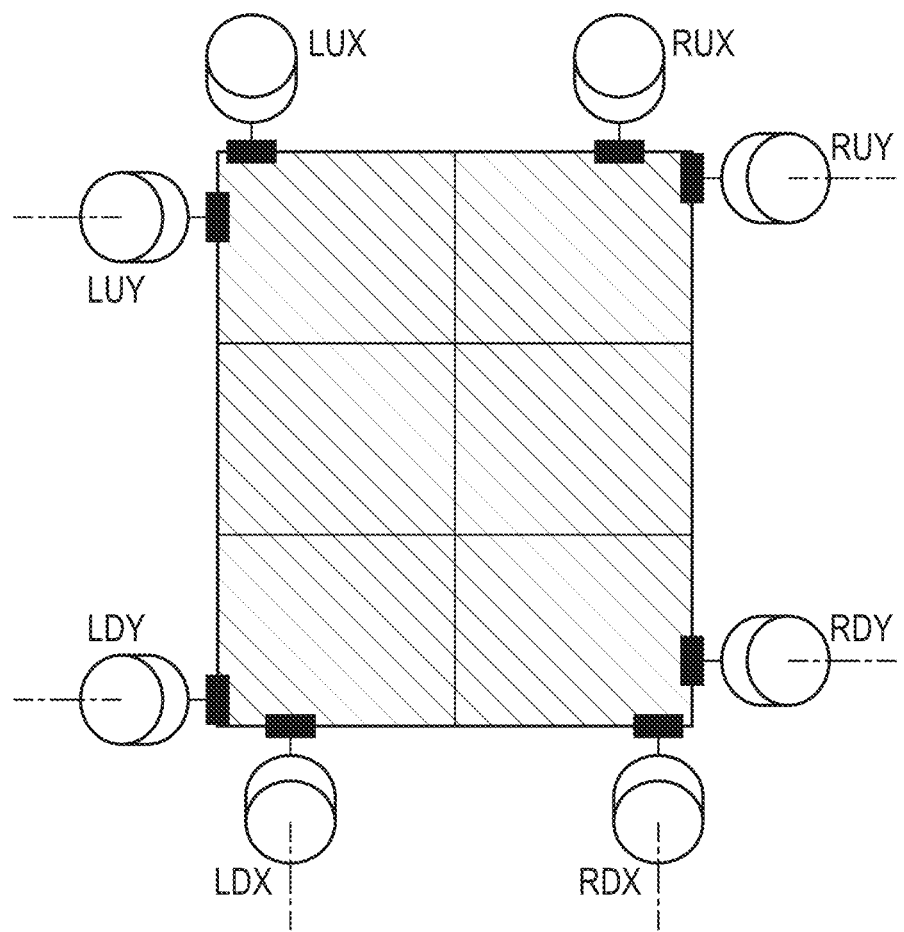
FIG. 2 is a view illustrating the arrangement of a plurality of scopes which constitute a measurement unit.

In the first embodiment, marks including alignment marks and overlay measurement marks are arranged at the four corners of each shot region. FIG. 2 illustrates the arrangement of a plurality of scopes LUX, LUY, LDX, LDY, RUX, RUY, RDX, and RDY which constitute the measurement unit 60. The scope LUX is arranged to observe the upper left corner of the shot region in the plan view, and serves to measure the position or positional shift in the X-direction. The scope LUY is arranged to observe the upper left corner of the shot region in the plan view, and serves to measure the position or positional shift in the Y-direction. The scope LDX is arranged to observe the lower left corner of the shot region in the plan view, and serves to measure the position or positional shift in the X-direction. The scope LDY is arranged to observe the lower left corner of the shot region in the plan view, and serves to measure the position or positional shift in the Y-direction. The scope RUX is arranged to observe the upper right corner of the shot region in the plan view, and serves to measure the position or positional shift in the X-direction. The scope RUY is arranged in the upper right corner of the shot region in the plan view, and serves to measure the position or positional shift in the Y-direction. The scope RDX is arranged to observe the lower right corner of the shot region in the plan view, and serves to measure the position or positional shift in the X-direction. The scope RDY is arranged to observe the lower right corner of the shot region in the plan view, and serves to measure the position or positional shift in the Y-direction.

Figure 4:
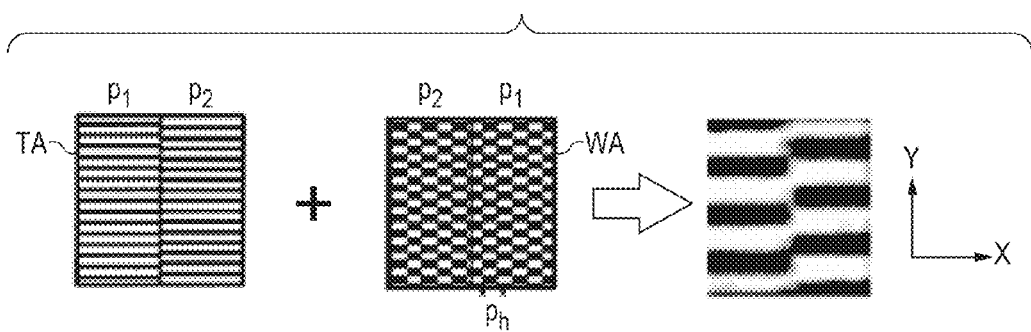
FIG. 4 is a view illustrating an alignment mark arranged on a mold, an alignment mark arranged on the substrate, and moire fringes formed by them.

The measurement unit 60 including the plurality of scopes LUX, LUY, LDX, LDY, RUX, RUY, RDX, and RDY has, for example, the Littrow arrangement so as not to block the light guided from the curing unit 50 onto the resin R, as illustrated in FIG. 3. That is, each scope of the measurement unit 60 is configured to obliquely project light onto the mark, and observe the light which travels back the way it came in the direction in which it is projected. FIG. 4 illustrates an alignment mark TA arranged on the mold M and an alignment mark WA arranged on the substrate S to measure a positional shift between the mold M and the substrate S in the Y-direction. In the alignment mark WA, a grating is formed at a pitch Ph in the X-direction in correspondence with the Littrow arrangement. A grating is also formed in the Y-direction as the measurement direction, and the phase of moire fringes formed by the alignment marks WA and TA is detected to measure the amount of shift between the mold M and the substrate S. Accordingly, the alignment mark WA is a checkerboard mark in which gratings in the X- and Y-directions intersect at right angles.

FIG. 5 corresponds to a region indicated by a dotted frame in FIG. 1. FIG. 5 illustrates the situation in which shot region (0, 0) is aligned with the mold M, and is to be imprinted. Shot region (−1, 0) is already imprinted. Shot regions (−1, 1) and (0, 1) are not yet imprinted. A first chip of shot region (0, 0) is defined as (0, 0)−1. A second chip of shot region (0, 0) is defined as (0, 0)−2. Band-shaped regions defined between chips and between shots serve as scribe lines used to cut the chips.

Referring to FIG. 5, a portion indicated by a rectangular frame (for example, (−1, 0)−RUX) represents an alignment mark on the substrate S illustrated in FIG. 4. "(x, y)" of a reference symbol denoting an alignment mark represents a shot region having the alignment mark. Three alphabetical letters subsequent to "−" of a reference symbol represent the position in the shot region and the measuring direction (X or Y).

Referring again to FIG. 5, a portion indicated by a solid or dotted elliptical frame (for example, (−1, 0)−RUVX) represents an overlay measurement mark. The solid elliptical frame represents a finished (i.e. imprinted) overlay measurement mark, and the dotted elliptical frame represents an unfinished overlay measurement mark. "(x, y)" of a reference symbol denoting an overlay measurement mark represents a shot region having the overlay measurement mark. Four alphabetical letters subsequent to "−" of a reference symbol represent the position in the shot, overlay mark indicator and the measuring direction (X or Y). Note that "V" indicates the overlay measurement mark. The overlay measurement mark includes a mark imprinted from the mold M, and a mark formed in the substrate S. The overlay measurement mark is finished by superposing the mark of the mold by an imprint operation on the mark formed in each shot of the substrate. They overlap and form moiré fringes.

In an example shown in FIG. 5,
(a) an alignment mark ((0, 0)−LUY) in shot region (0, 0) to be imprinted, and an alignment mark on the mold M corresponding to it, and
(b) an overlay measurement mark ((−1, 0)−RUVY) in shot region (−1, 0) adjacent to shot region (0, 0) exist within the field of view of the common scope (for example, the scope LUY).

However, this condition is not indispensable, and this alignment mark and overlay measurement mark may be observed in parallel through different scopes.

Note that the parallel measurement of alignment and overlay is not limited to the simultaneous operation. For example, alignment measurement can be performed after the mold comes into contact with the resin in the shot region, and overlay measurement can be performed while the resin is cured. An imprint operation may also be done by performing overlay measurement and alignment measurement sequentially while the mold is brought into contact with the resin, and then curing is done. In either case, alignment measurement and overlay measurement need only be performed during a series of processes of transferring the pattern to the shot region to be imprinted.

In the imprint technique, unlike the optical exposure technique, a three-dimensional pattern can be formed on the substrate without development. Hence, in this embodiment, the measurement unit 60 measures the relative position between the mold M and the shot region to which the pattern is to be transferred, and that between the first pattern already imprinted in another shot region with the mold M, and the second pattern on the shot region of the substrate S. In other words, in this embodiment, overlay measurement of another shot region which is already imprinted is confirmed, while the alignment measurement for the imprinting shot is performed. When the alignment and the overlay measurement are performed most efficiently, overlay measurement for shot regions other than the last shot region is completed the moment the alignment measurement of the last imprinting shot is completed. Overlay measurement for the last shot region can be performed after the completion of the last shot imprinting. Note that when a shot region having not yet undergone overlay measurement remains except for the last shot region the moment the last shot imprinting is done, overlay measurement can be performed for this shot region as well.

FIG. 6A illustrates moire fringes observed through the scope LUY having an observation field of view indicated by an alternate long and two short dashed lines in FIG. 5. Upon an imprint operation in shot region (0, 0), moire fringes shown on the lower side of FIG. 6A are formed by the alignment mark in the Y-direction on the upper left side of the mold M, and the alignment mark (0, 0)–LUY already formed in shot region (0, 0) of the substrate S. These moire fringes represent a shift between these two alignment marks, and the relative position between the mold M and shot region (0, 0) is adjusted by the internal driving mechanism of the substrate stage 20. These moire fringes change upon the adjustment of the relative position between the mold M and shot region (0, 0) by the substrate stage 20. Moire fringes shown on the upper side of FIG. 6A are formed by the overlay measurement mark (−1, 0)–RUVY formed by an imprint operation of the shot region (−1, 0). These moire fringes represent the alignment status (overlay error) of shot region (−1, 0). These moire fringes are already formed by an imprint operation in shot region (−1, 0) and fixed, so their state remains the same even when the relative position between the mold M and shot region (0, 0) is adjusted by the internal driving mechanism of the substrate stage 20.

In the first embodiment, two moiré fringes are simultaneously observed within the field of view of the common scope LUY. One moiré fringe represents the current relative position between the mold M and the substrate S, and the other does the overlay status of the previous imprint operation.

Since the amount of shift of the overlay measurement mark in the previous imprint operation is small, the area of overlay measurement mark can be smaller than that of the alignment mark. It is therefore preferable to use different marks as an alignment mark and an overlay measurement mark to reduce the observation field. This makes it easy to make the two marks fall within the field of view of one scope.

FIG. 6B illustrates a moiré fringe observed through the scope RUY. Upon an imprint operation in shot region (0, 0), the moire fringe shown on the upper side of FIG. 6B is formed by the alignment mark in the Y-direction on the upper right side of the mold M, and the alignment mark (0, 0)–RUY already formed in shot region (0, 0). This moire fringe represents a shift between these two alignment marks, and the relative position between the mold M and shot region (0, 0) is adjusted by the internal driving mechanism of the substrate stage 20. The moiré fringe changes by the adjustment of the relative position between the mold M and shot region (0, 0). In the lower side of FIG. 6B, no moiré fringe is observed from the overlay measurement mark (1, 0)–LUVY position. In this embodiment, shot region (1, 0) is imprinted after shot region (0, 0), so the overlay measurement mark (1, 0)–LUVY is not finished at the time of shot region (0, 0) imprinting. Hence, in this case, no moire fringe can be observed from the overlay measurement mark (1, 0)–LUVY, so overlay measurement of shot region (1,0) cannot be performed. Overlay measurement of shot region (1,0) can be performed after shot region (1, 0) is imprinted. For example, it can be done during the alignment of shot region (2,0).

Figure 7:
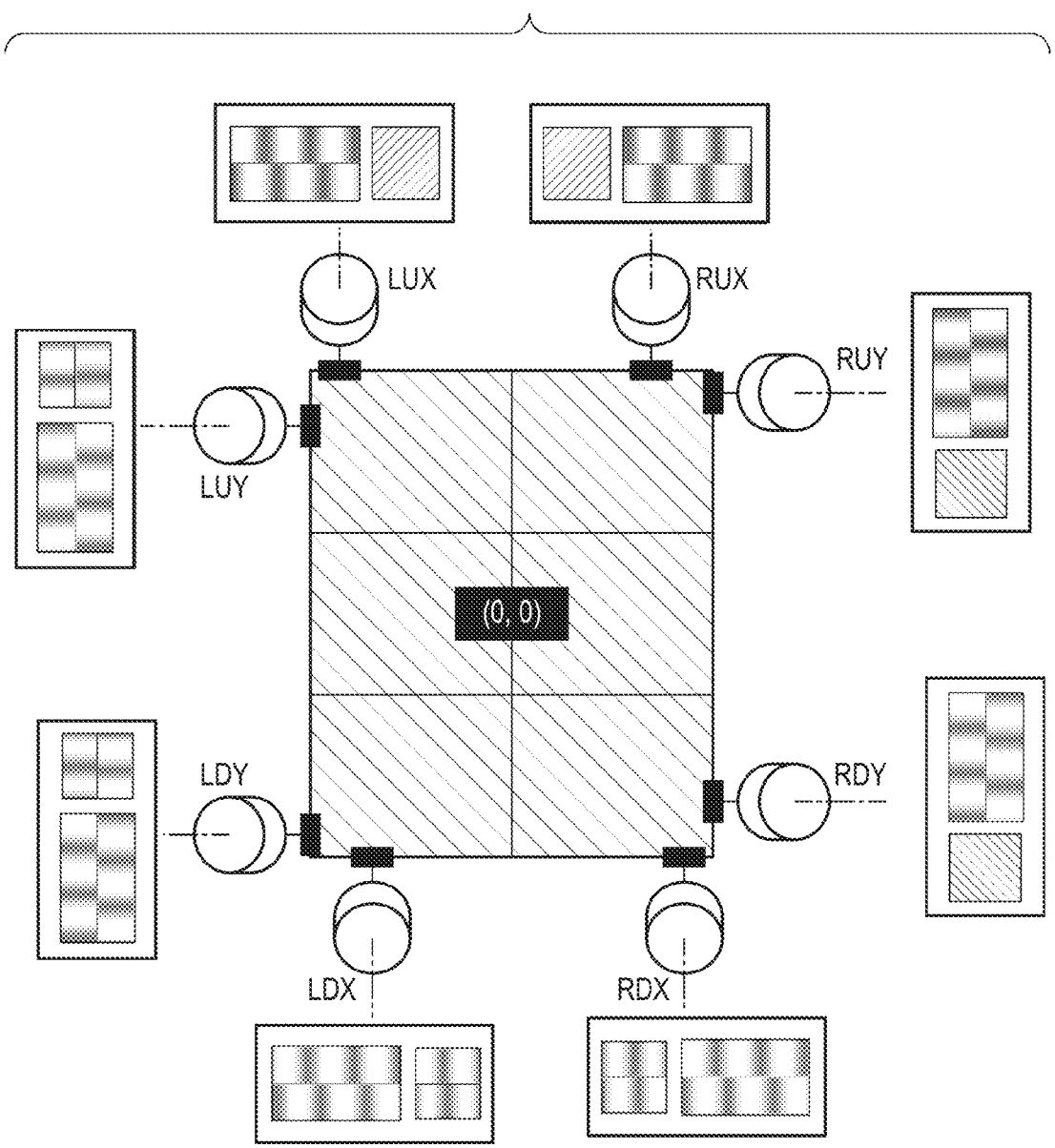
FIG. 7 is a view schematically showing moire fringes observed through the respective scopes of the measurement unit.

FIG. 7 schematically shows moire fringes observed through the respective scopes of the measurement unit 60 in shot region (0, 0) imprinting. All scopes observe moire fringes formed by the alignment measurement marks. Overlay measurement marks in shot regions on the right and the upper sides are not imprinted yet, so overlay measurement cannot be performed for these shot regions during the shot region (0, 0) imprinting. The aim of the overlay measurement is to monitor the alignment status of the imprinted shot region. At least one overlay measurement in the X- and Y-direction in a shot, therefore, can be a good indicator for checking the overlay status.

To transfer the pattern to a plurality of shot regions on a substrate, a series of processes is repeated; bringing the mold into contact with the resin while aligning the mold with the shot region, performing exposure, separating the mold from the resin, and performing step movement to the next shot region. Among these, the process of bringing the mold into contact with the resin while aligning the mold with the shot region (to be simply referred to as a contact process hereinafter) requires the longest time. A contact process typically takes the order of seconds, and this becomes the maximum factor which limits the throughput of the imprint apparatus. If the overlay measurement of an adjacent shot is performed in parallel during the alignment operation, this does not lower the throughput of the imprint apparatus. As the moire fringes observed in overlay measurement are already fixed, stable overlay measurement can be performed free from the influence of factors associated with execution of an alignment operation such as resist spreading.

One of the desired arrangement of on the left scribe line is shown in FIG. 5. The marks (−1, 0)–RUY, (0, 0)–LUVY, (−1, 0)–RUVY, and (0, 0)–LUY are adjacent each other on the scribe line of shot region (0, 0) More generally, it is desired to arrange an alignment mark and an overlay mark of the adjacent shot brought into the adjacent position on the substrate after imprinting. It is desirable to alternately arrange two types of marks in the order of an alignment mark, overlay measurement mark, overlay measurement mark, and alignment mark. The use of such an arrangement allows simultaneous observation of two types of marks through common scopes having a relatively small field of view.

As the configuration of an overlay measurement mark, not only the mark illustrated in FIG. 4, but also various modifications are available. In the scheme of moiré fringe detection system, the moiré fringes return to the original state, when the amount of shift between marks formed by grating patterns reaches a value corresponding to one pitch of the grating patterns. To prevent this, a pattern that has a coarse resolution but has a wide capture range can be added.

Figure 8:
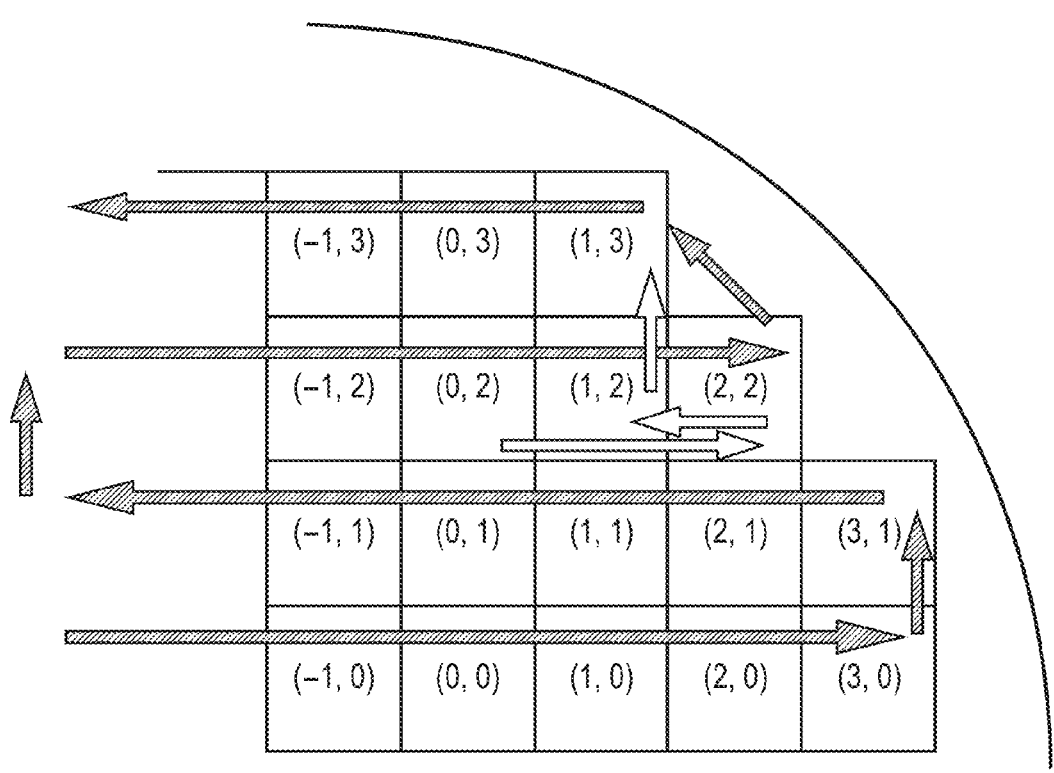
FIG. 8 is a view illustrating the order of imprinting.

An inconvenience occurs in observation of an overlay measurement mark of the adjacent shot region, depending on the shot layout. FIG. 8 is a view illustrating an example of the layout of shot regions. In the layout on a circular substrate, such as a wafer, the number of shot regions varies in each column (each row) according to the outer shape of the substrate, as shown in FIG. 8. When the imprinting is performed sequentially like a normal stepper as indicated by filled arrows, shot region (2, 2) is not adjacent to shot region (1, 3) to be processed next. So, shot regions (2,2) and (1,3) do not share a scribe line. Therefore, in shot region (2, 2), overlay measurement cannot be performed in parallel with alignment measurement.

Hence, when the order of imprinting is changed to (0, 2)→(2, 2)→(1, 2)→(1, 3), the overlay status of imprinted shot regions can be confirmed without loss in the normal imprint sequence as indicated by open arrows. In shot region (1, 2), overlay measurement can be performed for shot regions (0, 2),(2, 2) and (1,1) which are already imprinted. In overlay measurement, shot regions to which the diagonal step movement is required before imprinting cause such a detection problems. So, the step movement only in the X- and Y-directions is desirable.

Note that the last shot region is an exception because the overlay measurement cannot be done before imprinting. A special overlay measurement sequence must be performed for the last shot region after the end of imprinting, and then the substrate is unloaded outside the imprint apparatus.

The above-mentioned operation requires a special sequence in the last shot region. However, according to this embodiment, the alignment status of all imprinted shot regions can be determined at the time of unloading. There is no need to take a special independent checking operation for overlay, to save the total process time for wafer processing. The overlay measurement results can be transferred to a host computer. If no abnormal overlay value is detected from the imprinted substrate, it is transferred to the next etching process. If abnormal values are detected, it is transferred to a rework process. Also, if abnormal values are continuously detected, a given measure such as mold replacement can be taken with the output of warning information.

Second Embodiment

The second embodiment of the present invention will be described below. Details which are not particularly referred herein can be the same as in the first embodiment. In the second embodiment, the imprinted alignment marks are used for overlay measurement. That is, in the second embodiment, the same mark serves both as an alignment mark and an overlay measurement mark. FIG. 9 illustrates the situation in which shot region (0, 0) is aligned with a mold M, and is imprinted. Note that FIG. 9 corresponds to a region indicated by a dotted frame in FIG. 1. Shot region (−1, 0) is already imprinted, while shot regions (−1, 1) and (0, 1) are not imprinted yet.

With the imprint operation of shot region (−1, 0), a new overlay mark is formed on an alignment mark, which is already formed on a substrate S, in superposition using the mold M. By imprinting, an alignment mark is converted to an overlay mark by the superposition of two alignment marks on the mold and the substrate. Therefore, when two marks as shown in the left and the center portions of FIG. 4 are used, moire fringes corresponding to their shift can be observed by superposition, shown in the right portion of FIG. 4. For example, with the imprint operation of shot region (−1, 0), a new overlay mark is formed on the position of (−1, 0)–RUY in superposition. Before imprinting, (−1, 0)–RUY mark serves as an alignment mark, but it works as an overlay mark after imprinting. Following the notation in the first embodiment, an overlay measurement mark (−1, 0)–RUVY is on the same as the imprinted alignment mark (−1, 0)–RUY.

FIG. 10A illustrates moire fringes observed through a scope LUY. During the imprint operation in shot region (0, 0), moire fringes shown on the lower side of FIG. 10A are formed by the alignment mark in the Y-direction on the upper left side of the mold M, and the alignment mark (0, 0)–LUY formed in shot region (0, 0). These moire fringes represent a shift between these two alignment marks, and the relative position between the mold M and shot region (0, 0) is adjusted by the internal driving mechanism of a substrate stage 20. These moiré fringes change with the adjustment of the relative position between the mold M and shot region (0, 0) by the internal driving mechanism of the substrate stage 20.

Moiré fringes shown on the upper side of FIG. 10A are formed by the overlay measurement mark (−1, 0)–RUY formed by an imprint operation in shot region (−1, 0). These moire fringes represent the alignment status (overlay error) of shot region (−1, 0), and are already fixed by imprinting. So, they always show the same value even during the alignment operation in shot region (0, 0). This allows stable overlay measurement.

FIG. 10B illustrates moire fringes observed through a scope RUY. With the imprint operation in shot region (0, 0), moire fringes shown on the upper side of FIG. 10B are formed by the alignment mark in the Y-direction on the upper right side of the mold M, and the alignment mark (0, 0)–RUY formed in shot region (0, 0). These moire fringes represent a shift between these two alignment marks, and the relative position between the mold M and shot region (0, 0) is adjusted by the internal driving mechanism of the substrate stage 20.

The moiré fringes for overlay measurement of shot region (1,0) shown on the lower side of FIG. 10B are formed by the imprint operation in shot region (1,0). In the imprint operation in shot region (0,0), they are not imprinted yet. Therefore, no moire fringes are formed in the lower side of FIG. 10B.

Third Embodiment

The third embodiment of the present invention will be described below. Details which are not particularly referred herein can be the same as in the first embodiment. In the third embodiment, overlay measurement marks and alignment marks are observed in parallel through different scopes. To design a mold which implements alignment marks and overlay measurement marks, as described with reference to FIG. 5 in the first embodiment, it is preferable to alternately arrange alignment marks and overlay measurement marks on the substrate. This arrangement leads a considerable constraint to the pattern design in the scribe line. To alternately arrange alignment marks and overlay measurement marks on the substrate, an alignment mark on the left side of the mold, for instance, must be accompanied by an overlay mark on the right side. Alignment marks and overlay measurement marks must be arranged so that they are in proximity to each other with the imprint operation in an adjacent shot region. Referring to FIGS. 6A and 6B in the first embodiment, the overlay measurement mark (−1, 0)–RUVY and alignment mark (0, 0)–LUY, that is, marks on the right and left sides of adjacent shot regions are simultaneously observed. As a result, each side of the mold forms a zigzag pattern because of the staggered layout. The mold used in imprinting has a mesa (flat-topped) structure, in which the mesa height is 10 to 50 μm. In order to simplify the zigzag pattern surrounding the mesa, it is desirable that alignment marks and overlay measurement marks can be freely arranged each other.

Figure 11:
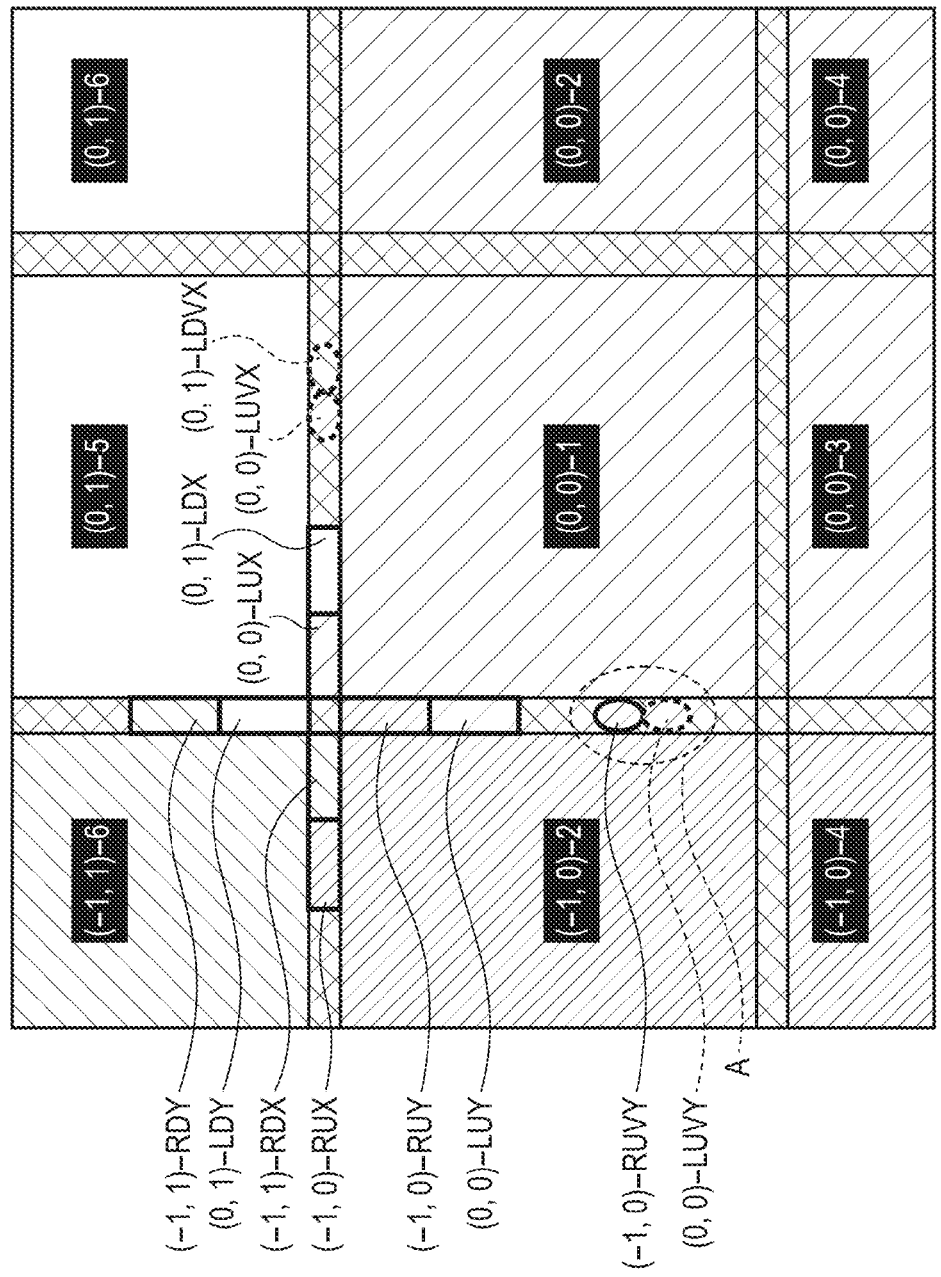
FIG. 11 is a view illustrating the arrangement of marks.

FIG. 11 shows overlay measurement marks (0, 0)–LUVX and (0, 0)–LUVY in shot region (0, 0), and an overlay measurement mark (−1, 0)–RUVY in shot region (−1, 0). In an area A, the overlay measurement marks (0, 0)–LUVY and (−1, 0)–RUVY are arranged adjacent to each other in adjacent shot regions.

FIG. 12 illustrates the arrangement of a plurality of scopes which constitute a measurement unit 60 in the third embodiment. Eight scopes LUVX, LUVY, LDVX, LDVY, RDVX, RDVY, RUVX, and RUVY are added to the array of scopes shown in FIG. 2. During the imprint operation of shot region (0, 0), overlay measurement mark (−1, 0)–RUDY, which is already imprinted, is observed through the scope LUVY. The position of the scope LUVY is adjusted to observe the overlay measurement mark (−1, 0)–RUDY. The positions of other scopes are adjusted similarly.

In FIG. 12, two scopes are added for each side, that is, a total of eight scopes are added to observe the overlay measurement marks. In another embodiment, only one scope may be added for each side on the assumption that the overlay verification is enough to check one measurement per each side. If the imprint is done from the bottom to the top of the substrate, no imprinted overlay measurement mark exist on the upper side of the shot region during imprinting operation. In such a case, therefore, the scope to observe the overlay measurement mark on the upper side can be omitted. To reduce the number of scopes contributes the cost reduction.

Figure 13:
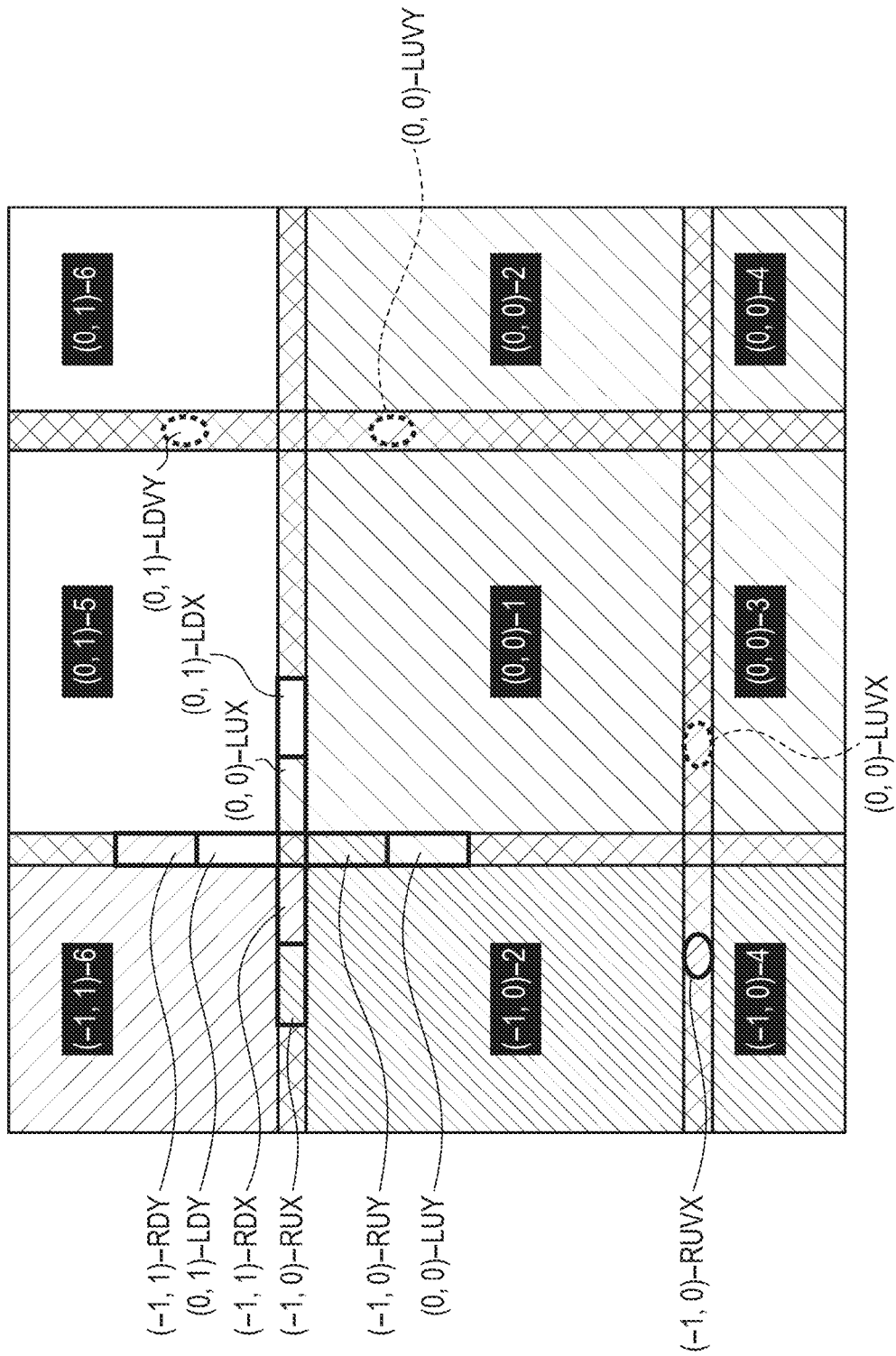
FIG. 13 is a view illustrating the arrangement of marks.

Overlay measurement marks need not always be arranged between shot regions, and they can be arranged on scribe lines between chips within the shot region, as illustrated in FIG. 13. In this case, scopes are configured so that such overlay measurement marks can be observed.

Fourth Embodiment

Figure 14:
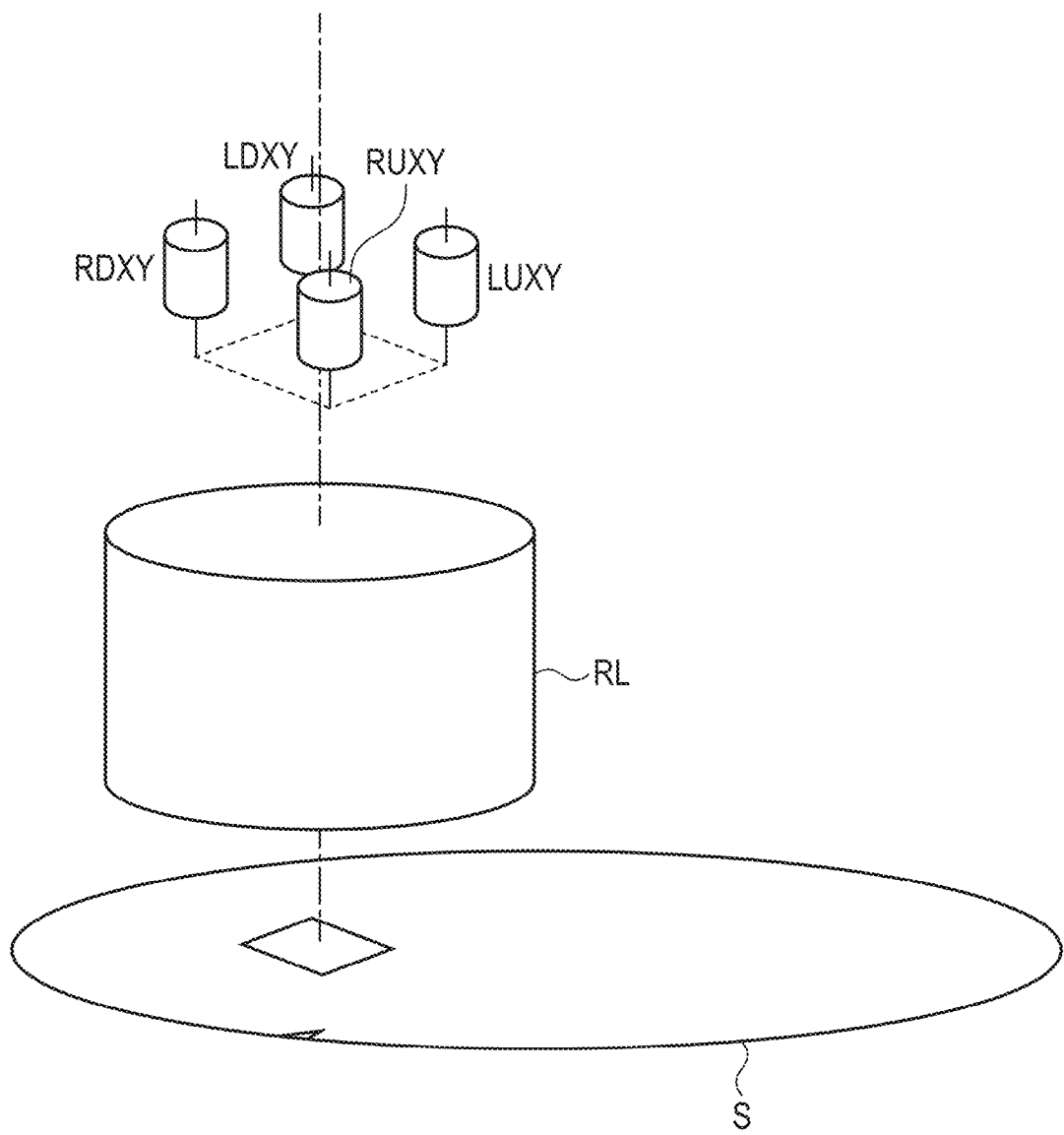
FIG. 14 is a perspective view illustrating the arrangement of scopes.

The scopes of the measurement unit 60 are arranged in proximity to the mold M in the first to third embodiments. In these embodiments, the mechanical interference between the curing unit 50 and measurement unit 60 is critical. In such a case, scopes LUXY, LDXY, RUXY, and RDXY, for example, can be spaced apart from a mold M by providing a relay optical system RL, as illustrated in FIG. 14. Relay optical system RL has the function to cure the resin, but it is not illustrated in FIG. 14.

Referring to FIG. 14, a position indicated by a dotted quadrangular frame represents the conjugate plane of the mold M and a substrate S, which are in contact. The intermediate images of alignment marks and overlay measurement marks are formed by the relay optical system RL. In the arrangement of scopes shown in FIG. 14, the optical axes of the scopes LUXY, LDXY, RUXY, and RDXY are incident to the surface of the substrate S perpendicularly. Note that the scope LUXY can measure a positional shift in the X- and Y-directions at the upper left position within the shot region in the plan view. The scope LDXY can measure a positional shift in the X- and Y-directions at the lower left position within the shot region in the plan view. The scope RUXY can measure a positional shift in the X- and Y-directions at the upper right position within the shot region in the plan view. The scope RDXY can measure a positional shift in the X- and Y-directions at the lower right position within the shot region in the plan view.

To achieve dark field detection by an optical system having an optical axis extending perpendicularly to the surface of the substrate S, the group of scopes shown in FIG. 14 can adopt an optical system having the pupil frequency filtering configuration. This group of scopes can also adopt a configuration which receives obliquely incident illumination light and detects it by the optical axis extending perpendicularly to the surface of the substrate S, or its opposite configuration. A bright field observation can also be done if the optical axis of the illumination light extends perpendicularly to the surface of the substrate S.

When the optical axes of the scopes extend perpendicularly to the surface of the substrate S, the detection system doesn't have the directionality due to the oblique incidence illustrated in FIG. 3. In the Littrow arrangement, one direction of a grating structure is used to return the obliquely incident light to the original direction. The other direction perpendicular to the Littrow requirement is used to detect the shift between the alignment marks. It is difficult to detect X and Y shifts simultaneously with one Littrow-arranged scope. If the optical axis of a scope is perpendicular to the surface of the substrate S, the simultaneous detection of the X- and Y-directions within one field of view is made possible. In a configuration shown in FIG. 14, four scopes suffice the detection of X-Y shifts at four positions.

Figure 15:
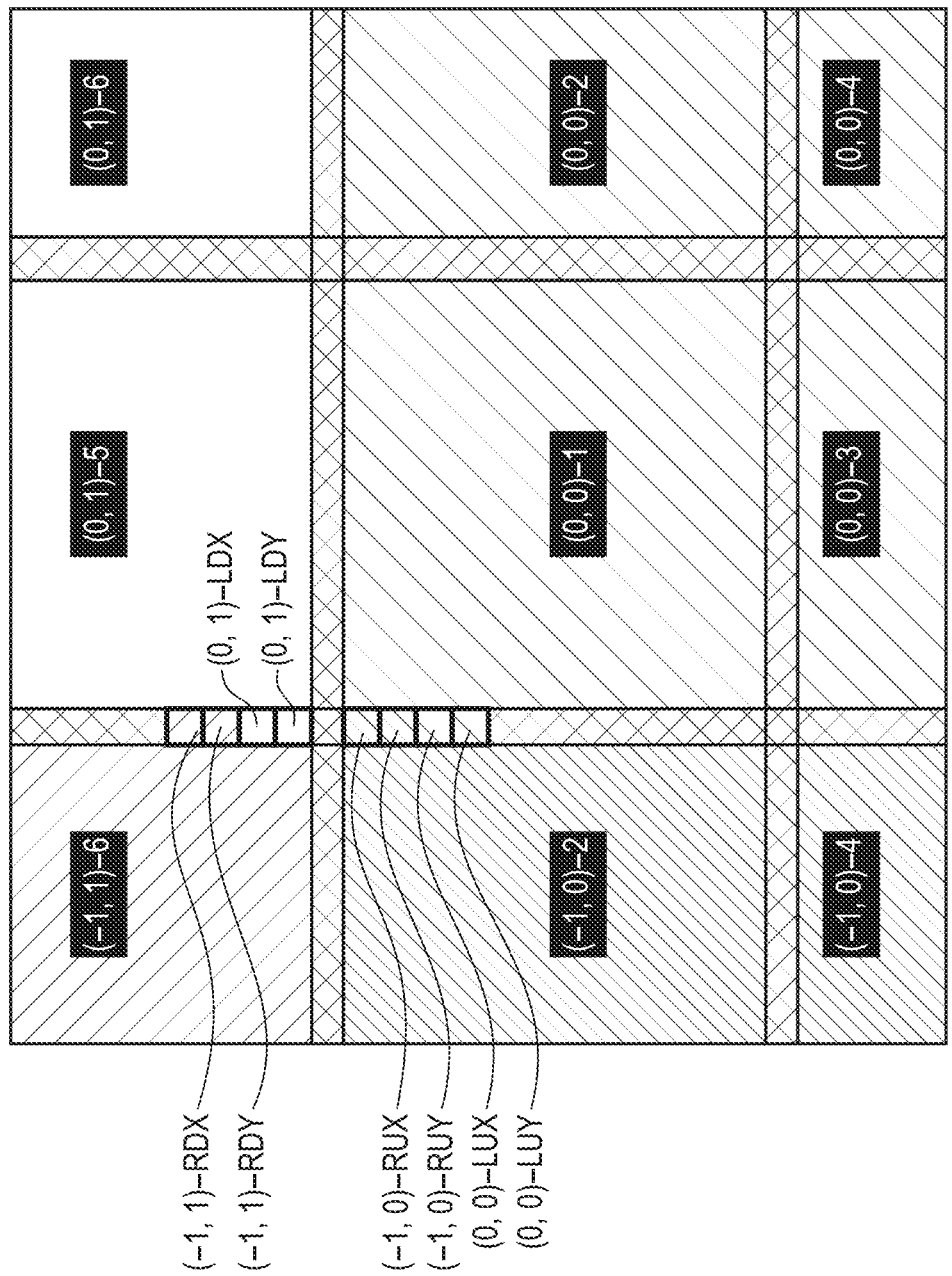
FIG. 15 is a view illustrating the arrangement of marks.
Figure 16:
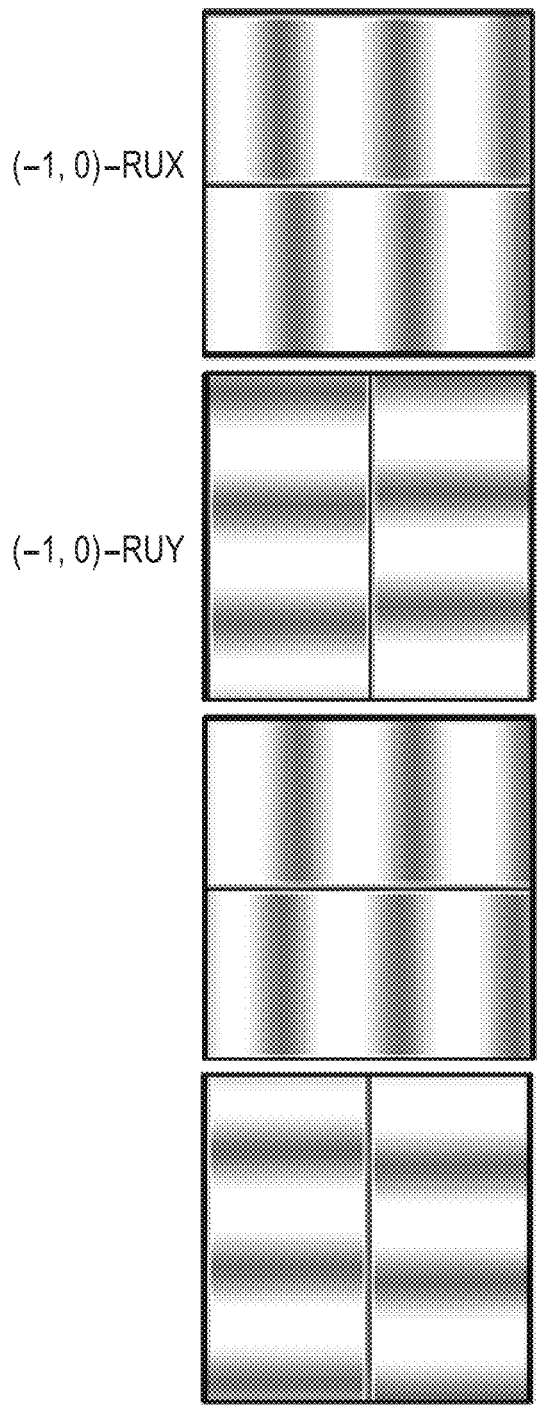
FIG. 16 is a view illustrating moire fringes observed through scopes.

With this scope system, it is possible to observe marks arranged in the same way as in the first to third embodiments. FIG. 15 shows an arrangement corresponding to a mode in which alignment marks can be used as overlay measurement marks after imprinting, as in the second embodiment. In this example, all marks fall within scribe lines in the Y-direction. FIG. 16 illustrates images observed through the scope LUXY. Moire fringes as shown in FIG. 16 are observed. Four moiré charts can be observed in the field of the scope LUXY. The lower two moiré charts represent the alignment signals between the mold M and shot region (0, 0). According to these signals, the internal driving mechanism of a substrate stage 20 adjusts the relative relationship between the mold M and the substrate S. The upper two moiré charts represent the overlay status of the shot region (−1,0). Alignment marks on the mold M are already imprinted onto the alignment marks (−1, 0)–RUX and (−1, 0)–RUY in shot region (−1, 0) to form overlay measurement marks. By observing moire fringes formed by these overlay measurement marks, alignment errors in shot region (−1, 0) can be measured.

Fifth Embodiment

Figure 17:
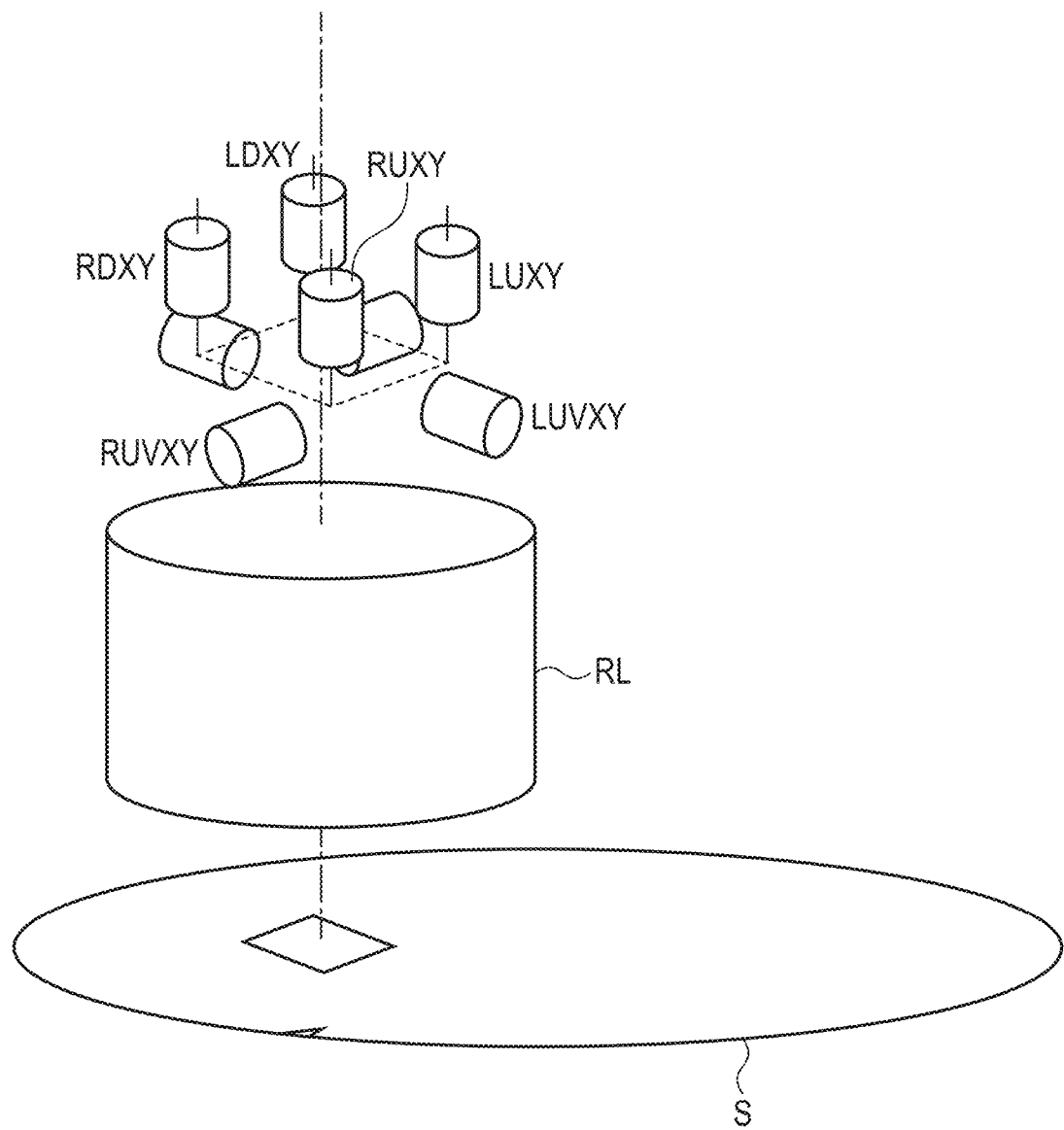
FIG. 17 is a perspective view illustrating the arrangement of scopes.

As in the third embodiment, when alignment marks and overlay measurement marks are spaced apart from each other, the use of a relay optical system RL generates a given degree of freedom in the arrangement of scopes. FIG. 17 illustrates an example of the arrangement of scopes. In the arrangement example shown in FIG. 17, scopes LUVXY, LVVXY, RUVXY, and RDVXY for observing overlay measurement marks are arranged in addition to the scopes in the arrangement example shown in FIG. 14.

[Method of Manufacturing Article]

A method of manufacturing an article using the above-mentioned imprint apparatus will be described below. This manufacturing method includes a step of forming the pattern of a resin on a substrate using the above-mentioned imprint apparatus, and a step of processing (for example, etching) the substrate having the pattern formed on it. The article can be a device such as a semiconductor device, a liquid crystal display device, or a micromachine.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-018637, filed Jan. 31, 2012, which is hereby incorporated by reference herein in its entirety.

What is claimed is:

1. An imprint apparatus for forming a pattern on a substrate by imprinting, the imprint apparatus comprising:
  a measurement unit including a scope having a field of view and configured to perform:

alignment measurement where a relative position between the mold and a shot region on the substrate is measured to align the mold and the shot region; and overlay measurement where a relative position between a first pattern already formed in a shot region on the substrate using the mold, and a second pattern in the substrate underlying the first pattern is measured; and a control unit configured to cause the measurement unit to perform, in parallel, the alignment measurement for a shot region to be imprinted on the substrate and the overlay measurement for a shot region on which a pattern has been formed on the substrate by imprinting, using a mark in the substrate and a mark in the mold for the alignment measurement for the shot region to be imprinted and an overlay measurement mark in the substrate for the overlay measurement for the shot region on which the pattern has been formed by imprinting falling within the field of view of the scope, the overlay measurement mark comprising a mark in the first pattern and a mark in the second pattern.

2. The apparatus according to claim 1, wherein the control unit is configured to control the measurement unit so that a shot region to undergo the overlay measurement is adjacent to a shot region to undergo the alignment measurement.

3. The apparatus according to claim 1, wherein the control unit is configured to control the measurement unit so that the overlay measurement is performed for a shot region that has not yet undergone the overlay measurement after the pattern is formed on the last shot region on the substrate.

4. The apparatus according to claim 1, wherein the control unit is configured to control the measurement unit so that a mark on the substrate to be used for the overlay measurement is different from a mark on the substrate to be used for the alignment measurement.

5. The apparatus according to claim 1, wherein the control unit is configured to control the measurement unit so that a mark on the substrate to be used for the overlay measurement is identical to a mark on the substrate to be used for the alignment measurement.

6. The apparatus according to claim 1, wherein:
imprinting is performed for a plurality of shot regions on the substrate, and
the control unit is configured to cause the measurement unit to perform the overlay measurement for a last shot region imprinted last, from among the plurality of shot regions, after the last shot region is imprinted.

7. The apparatus according to claim 1, further comprising an output unit configured to output warning information based on the overlay measurement.

8. The apparatus according to claim 1, further comprising a transfer unit configured to transfer a result of the overlay measurement to a host computer.

9. An imprint apparatus for forming a pattern on a substrate by imprinting, the apparatus comprising:
a measurement unit configured to perform:
alignment measurement to measure a relative position between the mold and a shot region on the substrate to align the mold and the shot region; and
overlay measurement to measure a relative position between a first alignment mark already formed in a shot region on the substrate using the mold and a second alignment mark in the substrate underlying the first alignment mark; and
a control unit configured to cause the measurement unit to perform in parallel:
the overlay measurement for a first shot region on the substrate, for which the first alignment mark has been formed on the substrate by imprinting using the mold; and
the alignment measurement for a second shot region on the substrate, for which a pattern is to be formed on the substrate by imprinting using the mold,
wherein the alignment measurement for the first shot region is performed using an alignment mark on the substrate for the first shot region and an alignment mark on the mold, and
wherein the overlay measurement for the first shot region is performed using an overlay measurement mark constituted by the second alignment mark in the substrate for the first shot region and the first alignment mark formed by the alignment mark on the mold by imprinting on the first shot region.

10. The apparatus according to claim 9, wherein:
the measurement unit includes scopes, and
the control unit is configured to cause the measurement unit to perform the alignment measurement and the overlay measurement in parallel using the scopes.

11. The apparatus according to claim 9, wherein the control unit is configured to control the measurement unit so that a shot region to undergo the overlay measurement is adjacent to a shot region to undergo the alignment measurement.

12. The apparatus according to claim 9, wherein the control unit is configured to control the measurement unit so that the overlay measurement is performed for a shot region that has not yet undergone the overlay measurement after the pattern is formed on the last shot region on the substrate.

13. The apparatus according to claim 9, wherein:
imprinting is performed for a plurality of shot regions on the substrate, and
the control unit is configured to cause the measurement unit to perform the overlay measurement for a last shot region imprinted last, from among the plurality of shot regions, after the last shot region is imprinted.

14. The apparatus according to claim 9, further comprising an output unit configured to output warning information based on the overlay measurement.

15. The apparatus according to claim 9, further comprising a transfer unit configured to transfer a result of the overlay measurement to a host computer.

16. A method of manufacturing an article, the method comprising the steps of:
forming a pattern on a substrate by imprinting using an imprint apparatus; and
processing the substrate having the pattern formed thereon, wherein the imprint apparatus comprises:
a measurement unit including a scope having a field of view and configured to perform:
alignment measurement where a relative position between the mold and a shot region on the substrate is measured to align the mold and the shot region; and
overlay measurement where a relative position between a first pattern already formed in a shot region on the substrate using the mold, and a second pattern in the substrate underlying the first pattern is measured; and
a control unit configured to cause the measurement unit to perform, in parallel, the alignment measurement for a shot region to be imprinted on the substrate and the overlay measurement for a shot region on which a pattern has been formed on the substrate by imprinting, using a mark in the substrate and a mark in the mold for the alignment measurement mark in the substrate for the shot region to be imprinted and an overlay measurement mark in the substrate for the overlay measurement for the shot region on which the pattern has been formed by imprinting falling within the field of view of the scope, the overlay measurement mark comprising a mark in the first pattern and a mark in the second pattern.

* * * * *